United States Patent [19]

Bolger

[11] Patent Number: 4,562,456

[45] Date of Patent: Dec. 31, 1985

[54] ANALOG-TO-DIGITAL CONVERSION APPARATUS INCLUDING A CIRCUIT TO SUBSTITUTE CALCULATED VALUES WHEN THE DYNAMIC RANGE OF THE CONVERTER IS EXCEEDED

[75] Inventor: Thomas V. Bolger, Merchantville, N.J.

[73] Assignee: RCA Corporation, Princeton, N.J.

[21] Appl. No.: 542,706

[22] Filed: Oct. 17, 1983

[51] Int. Cl.[4] .......................................... H03K 13/175
[52] U.S. Cl. ..................................... 358/13; 358/141; 340/347 AD
[58] Field of Search ................................ 358/13, 141; 340/347 AD; 364/722

[56] References Cited

U.S. PATENT DOCUMENTS

| | | | |
|---|---|---|---|
| 3,027,079 | 3/1962 | Fletcher et al. | 235/154 |
| 3,699,325 | 10/1972 | Montgomery, Jr. et al. | 235/154 |
| 3,930,256 | 12/1975 | Amemiya | 340/347 R |
| 3,967,269 | 6/1976 | Fletcher | 340/347 AD |
| 3,981,006 | 9/1976 | Takayama et al. | 340/347 AD |
| 4,244,004 | 1/1981 | Yamada | 340/347 AD |
| 4,251,802 | 2/1981 | Horna | 340/347 AD |
| 4,308,524 | 12/1981 | Harrison et al. | 340/347 AD |

FOREIGN PATENT DOCUMENTS 164387  9/1983  Japan ................................ 358/141

OTHER PUBLICATIONS

A. R. Balaban, U.S. patent application Ser. No. 443,929, filed 11/23/82, entitled "Digital Television Receiver With Analog-to-Digital Converter Having Time Multiplexed Gain".

J. F. Schanne, U.S. patent application Ser. No. 316,658, filed 10/30/81, entitled "Adaptive Analog-to-Digital Converter System".

Primary Examiner—John W. Shepperd
Attorney, Agent, or Firm—Eugene M. Whitacre; Paul J. Rasmussen; Eric P. Herrmann

[57] ABSTRACT

The quantizing resolution of an analog-to-digital converter is effectively enhanced for sinusoidal input signals by (a) sampling the signal at 90 degree intervals of the sinusoid; (b) establishing the input range of the converter to be less than the dynamic range of the signal but arranged so that at least three of four successive samples are true or correct values; (c) detecting the occurrence of saturated fourth sample values; (d) calculating correct values for saturated sample values from preceding samples; and (e) substituting calculated values for saturated incorrect values.

8 Claims, 10 Drawing Figures

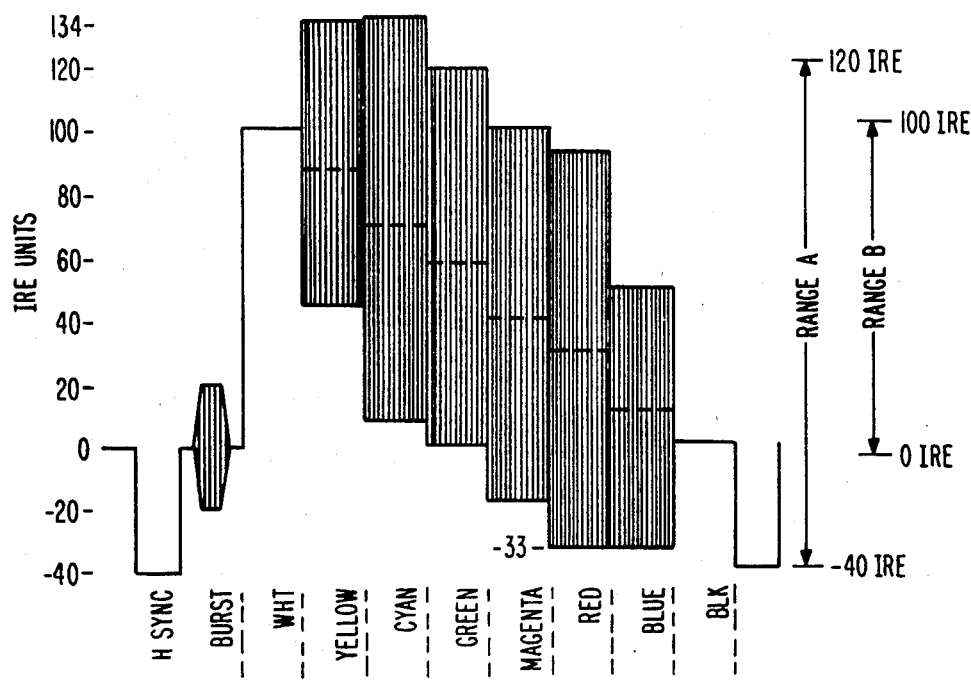
Fig. 1a
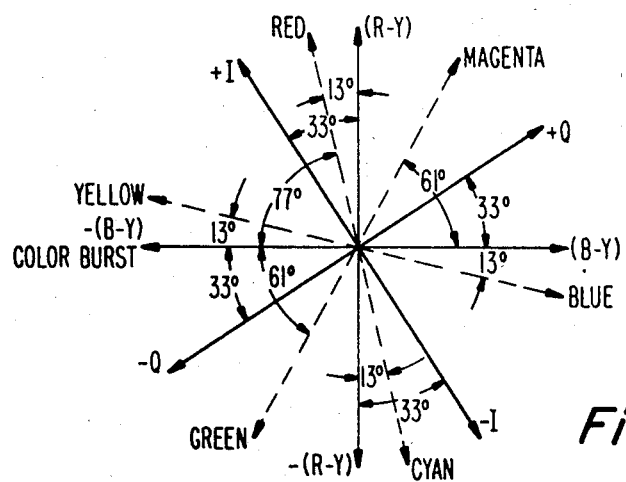
Fig. 1b
Fig. 1c
| IRE | CHROMINANCE | LUMINANCE |
|---|---|---|
| WHITE | 0 | 100 |
| YELLOW | 45 | 89 |
| CYAN | 63 | 70 |
| GREEN | 59 | 59 |
| MAGENTA | 59 | 41 |
| RED | 63 | 30 |
| BLUE | 45 | 11 |
| BLACK | 0 | 0 |

ANALOG-TO-DIGITAL CONVERSION APPARATUS INCLUDING A CIRCUIT TO SUBSTITUTE CALCULATED VALUES WHEN THE DYNAMIC RANGE OF THE CONVERTER IS EXCEEDED

This invention relates to analog-to-digital conversion of sinusoidal signals and in particular to conversion of composite video signals.

BACKGROUND OF THE INVENTION

Current developments in integrated circuits have made possible the design of commercial television receivers in which signal processing is performed digitally. In such receivers broadcast TV signals are typically processed through a conventional tuner and IF section and then converted to digital format for further processing. Desirably, the analog-to-digital converter (ADC) should perform the conversion to 8-bit accuracy in order to provide adequate resolution during processing and display of the received signal. However, currently available 8-bit ADC's capable of operating at the video bandwidth either dissipate excessive power or are too large to be produced with acceptable yields, especially when they are to be utilized in relatively low cost mass produced television receivers. One solution to these difficulties has been to digitize the analog signal with 7-bit accuracy while dithering the input signal by one-half LSB at the horizontal line scanning rate. The dither tends to increase the accuracy but introduces other artifacts which can degrade the processed signal.

SUMMARY OF THE INVENTION

The present invention employs a 7-bit ADC to digitize less than the full dynamic range of the video signal and calculates sample values for signal which exceeds the established range to provide ADC accuracy approaching 8-bits. Normally analog-to-digital conversion is performed over the input signal range from sync tip to peak white level, which is a range of approximately 120 IRE units in the NTSC television system. Picture information, however, resides in the range of approximately −20 IRE to 120 IRE. Considering that average color images are fifty percent saturated, the average signal range of picture information is about 110 IRE. This value is determined by adding fifty percent of the yellow and blue chrominance values respectively to fifty percent of the yellow and blue luminance values and subtracting the value of the most negative peak of the fifty percent blue signal from the most positive peak of the fifty percent yellow signal.

The color information portion of the composite NTSC color signal is a phase and amplitude modulated 3.58 MHz sinusoid. Digital conversion of this signal is conventionally performed at four times the 3.58 MHz color subcarrier rate, resulting in alternate samples being in a substantially 180 degree phase relationship. If the input range of the ADC is chosen to span less than the input signal range and the phase of the sampling points is judiciously selected, three of every four successive samples will fall within the input range of the ADC. The fourth sample will assume the saturation level of the ADC. However, since the input signal is substantially linear, sample estimates can be calculated from the three true samples and substituted for the saturated fourth sample. In this manner, a 7-bit ADC can be implemented to produce digitized samples which have signal-to-noise ratios approximately 3 dB down from a true 8-bit system rather than the normal 6 dB difference exhibited between 7 and 8-bit systems.

In one embodiment of the invention a 7-bit ADC is biased to operate over the signal range of zero IRE to 100 IRE. Sampling points at four times the color subcarrier rate are phased to produce at least three true samples out of four successive samples. A saturation detector indicates the occurrence of saturated samples and controls the substitution of a calculated sample for a saturated sample. The substituted samples, S, are calculated according to the equation $$S = C - (B - A)$$

wherein A, B and C are the values of the three immediately preceding valid samples.

BRIEF DESCRIPTION OF THE DRAWINGS

FIG. 1(a) illustrates one line of composite video exhibiting a color bar signal of 100 percent saturation, 1(b) the angular relationship of the chrominance vector for different saturated color signals and 1(c) a table of the luminance and chrominance amplitudes for the components of the color bar signal;

DETAILED DESCRIPTION OF THE INVENTION

Figure 2:
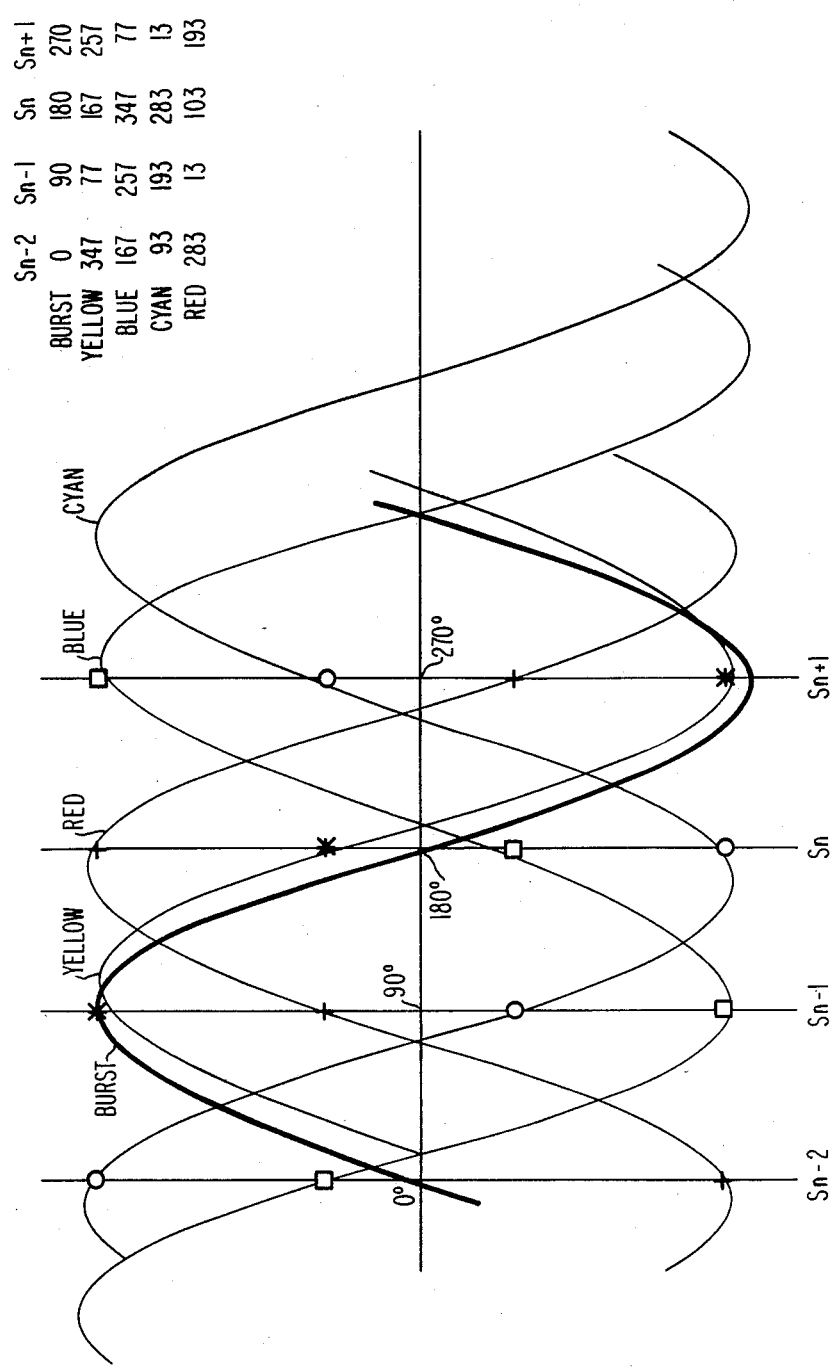
FIG. 2 is a waveform diagram including the color burst signal in relation to the chrominance signal for several representative colors.

FIG. 1(a) illustrates one line of NTSC composite video signal exhibiting a standard color bar signal of 100 percent color saturation. As is well known in the TV arts, the signal represented by the shaded portions is a phase and amplitude modulated 3.58 MHz sinusoid. The phase and peak-to-peak swing of the sinusoid represents the color component of the signal and the average value of the sinusoid represents the luminance component. Preceding the color bars is a color burst signal of approximately 9 cycles to which the phase of the color chrominance signals is referenced. The amplitude of the luminance and chrominance signals for the color bars are listed in FIG. 1(c) in IRE units. The angular relationships of the chrominance vectors for the primary colors relative to burst, i.e. −(B−Y), are shown in FIG. 1(b).

The illustrated waveform contains the maximum and minimum amplitude values of broadcast video signals. However, the occurrence of the maximum values is rare since the average color image is nominally 50 percent saturated. In light of this, traditional ADC's for digitizing video signals are biased to have an input range of from −40 IRE to +120 IRE, shown as Range A in the FIGURE. In the waveform of FIG. 1(a), horizontal sync pulses (H sync) and burst do not contain image information and normally are not processed in the video processing circuitry of a TV receiver. Thus, the negative limit of the ADC range for video signals may be set at −33 IRE. In practice however, most broadcast studios apply a set-up bias to the lower end of the luminance values resulting in a minimum image signal value of approximately −15 IRE (further compressing the image information range). The burst signal is, however, maintained with an average value of zero IRE and ± peaks of 20 IRE. It has been proposed that to digitize composite video, the ADC will be utilized most efficiently, if, during the period when sync and burst are present, the ADC is input biased at a level to most advantageously digitize burst and sync, and during the period of time that the image information is present, the signal is input biased across the range of image information signal. One such arrangement is described in U.S. Pat. No. 4,517,586, filed Nov. 23, 1982 and entitled "Digital Television Receiver with Analog-to-Digital Converter Having Time Multiplexed Gain". Time multiplexing the input range of the ADC enhances the quantizing resolution of the converter.

In accordance with a feature of this invention, the quantizing resolution of analog-to-digital conversion, at least in the video signal context, can be further enhanced by biasing the input range of the ADC to encompass less than the full range of image information and calculating values of samples occurring outside the ADC input range. Nominally, the video signal is a sinusoid and the sampling and conversion rate is four times the cyclic rate of the sinusoid. If the input range of the ADC is set to insure that three of four successive samples occur within the ADC input range, a fourth sample exceeding the input range can be calculated from the three valid samples. Consider a sinusoid sampled at 90 degree intervals with successive samples designated A, B, C and D. The value of sample D is equal to $C-(B-A)=A+C-B$ wherein A, B and C are the sample values. By monitoring the output of the ADC to detect samples having values which saturate the ADC and substituting calculated sample values for saturated samples, the range of the ADC is effectively increased.

Consider a 7-bit ADC biased for an input range of 140 IRE, e.g. from −20 IRE to +120 IRE. The quantizing resolution of the system is the input range divided by the number of quantization levels which for a 7-bit system will be 140/128. This yields 1.09 IRE per unit sample range. Next consider a 7-bit ADC biased for an input range of 100 IRE, e.g. from 0 IRE to +100 IRE and having circuitry for calculating sample values which reside outside of the input range. In this case, the quantizing resolution is 100/128 or 0.78 IRE, an improvement of 28 percent. Alternatively, this quantization resolution is only 28 percent poorer than that of an 8-bit system biased for the full 160 IRE range. Thus, a 7-bit ADC utilizing the present invention can provide quantizing resolution approaching that of an 8-bit ADC. Since the number of sampling stages is only one-half that of an 8-bit ADC the device is simpler and smaller. This results in a higher production yield and less cost as well as less heat and greater reliability.

FIG. 1(a) shows that maximum signal amplitudes occur for signals representing cyan and yellow colors (+134 IRE) and minimum amplitudes occur for red and blue colors (−33 IRE). Therefore, if the ADC system is designed to linearly process these peak level signals, signals of lesser peak values representing all other colors also will be linearly digitized.

Refer next to FIG. 2. In the figure the darker waveform represents the reference or burst signal which is in phase with the −(B−Y) color mixture signal. In digital TV systems it is convenient to demodulate the chrominance component of a composite video signal to its (R−Y) and (B−Y) color mixture signal components by sampling the composite signal in phase with burst. The vertical lines designated $S_{n-2}$ to $S_{n+1}$ represent sampling points of the signal. Generation of sampling signals per se is not part of this invention and any suitable conventional methods and circuits for selecting the phase of sampling signals may be utilized in constructing a system embodying this invention. The sample points illustrated in FIG. 2 are at 90 degree intervals of burst and occur at the zero crossings and ± peaks of the burst signal. The other waveforms in FIG. 2 correspond to the chrominance signal when it represents the designated colors red, blue, yellow and cyan. Note that yellow and blue chrominance signals are complementary and red and cyan are complementary. The chrominance signals illustrated are drawn with like amplitudes but it is to be understood that for equal color saturation the amplitudes will be different. The import of FIG. 2 is to show the approximate sampling phase on the chrominance signal for the different colors.

Figure 3:
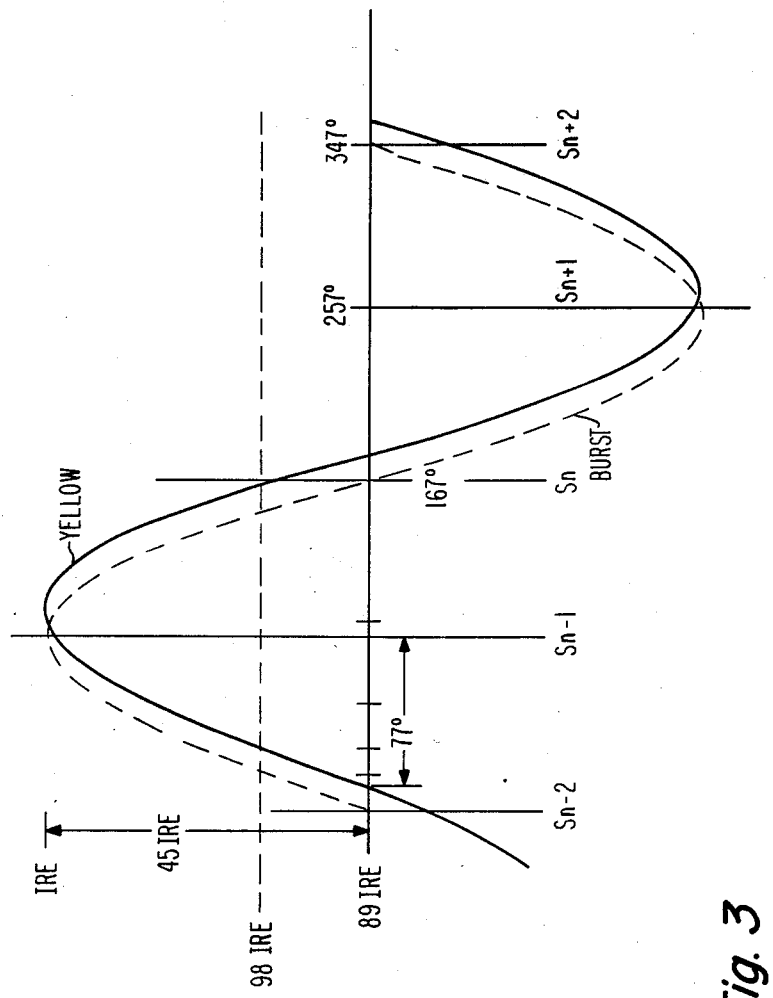
FIGS. 3 and 4 are expanded waveforms of portions of the chrominance signal of the FIG. 1(a) color bar signal for yellow and blue signals.

FIG. 3 illustrates one cycle of chrominance signal of the yellow color bar of FIG. 1(a) for 100 percent color saturation. The sampling points established in FIG. 2 have been translated to the FIG. 3 waveform. The average value of the peak-to-peak swing is established at the yellow luminance level of 89 IRE as illustrated in FIG. 1(a). The amplitudes at sample points $S_{n-2}$ and $S_{n+1}$ are between 89 IRE and 44 IRE. The amplitude at sample points $S_{n-1}$ and $S_n$ are 132.8 IRE and 99.1 IRE, respectively. Therefore an ADC having an input range between 0 and 100 IRE will generate at least three out of four true sample values for the waveform illustrated. For yellow chrominance signals that are less than 75 percent saturated, it can be shown that four out of four samples will be valid values.

Figure 5:
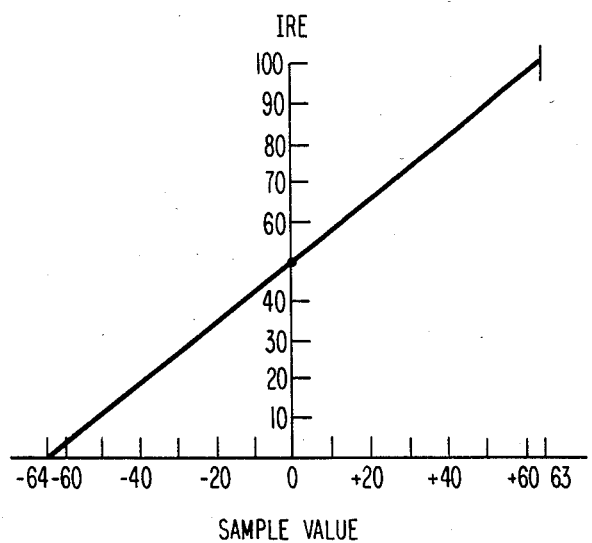
FIG. 5 is a graphical relation of the output of a 7-bit analog-to-digital converter biased to have an input range from zero to 100 IRE values.

Consider the 100 percent saturated yellow color signal sampled by a 7-bit ADC with its input range established over the range 0-100 IRE. Assume also that the ADC provides output sample values in two's complement format in which the 128 quantization levels are represented by binary numbers from −64 to +63. Thus, a zero IRE input will be represented by a −64 binary output number and a 100 IRE input by a +63 binary output number. Input signal between 0 and 100 IRE will be represented by the binary integers between −64 and +63 according to the linear translation shown in FIG. 5. For purposes of illustration, assume that the signal is in the steady state such that the sample value at point $S_{n+3}$ (not shown) is equal to the value at sample point $S_{n-1}$, i.e. 132.8 IRE. The sample values at $S_n=A$, $S_{n+1}=B$ and $S_{n+2}=C$ are respectively 99.1, 45 and 78.9 IRE. The corresponding binary values produced at the output of the ADC for the sample points $S_n$, $S_{n+1}$, $S_{n+2}$ and $S_{n+3}=S_{n-1}$ are +62, −6, +36 and +63. The +63 value output by the ADC is the upper saturation value and in error. The binary output value for the 132.8 IRE input value should be 104. Note the binary values are determined as follows. The zero output value of the ADC is established to correspond to the midpoint of the input range, i.e. at 50 IRE. Between 50 IRE and 100 IRE there are 63 quantization levels, and between 0 and 50 IRE there are 64 quantization levels. Therefore, each IRE unit above the 50 IRE level corresponds to 1.26 binary units and each IRE unit below the 50 IRE level corresponds to 1.28 binary units. The input IRE value is subtracted from 50 and the difference is then multiplied by the appropriate binary units, i.e. 1.26 or 1.28.

The binary value of 104 can be obtained from the prior three true sample values by substituting the ADC output values for sample points $S_n$, $S_{n+1}$ and $S_{n+2}$ into the equation $$S = C - (B - A)$$
$$= 36 - (-6 - 62)$$
$$= 104 \; . \quad (1)$$

In practice, the calculated value may not be exact due to accummulated round off errors inherent in the analog-to-digital conversion, however, the result will always be a very close approximation.

Since the 100 percent saturated yellow color signal presents the worst case condition for the upper end of the input range, if saturated output values are detected and substituted with calculated values, the ADC system will provide valid positive output samples for all colors of the chrominance signal.

Figure 4:
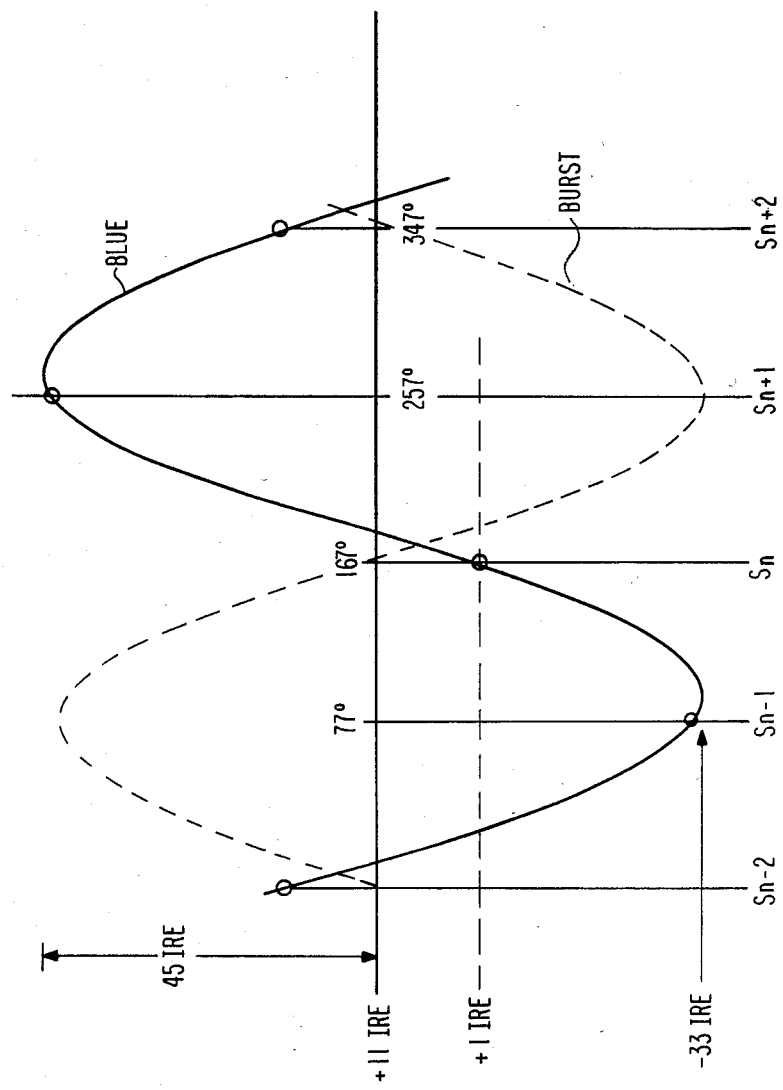

Next consider FIG. 4 which shows the chrominance signal representing the saturated blue color bar signal of FIG. 1(a). The blue signal is the worst case condition on the negative side of the input range. The analog sample values at $S_{n-1}$, $S_n$, $S_{n+1}$ and $S_{n+2}$ are $-33$, 1, 55 and 21 IRE. The corresponding digitized values output by the ADC are $-64$, $-63$, $+6$ and $-37$. The $-64$ value is a negative ADC saturation value. The binary number corresponding to $-33$ IRE should be $-106$. Substituting the values for $S_{n=A}$, $S_{n+1}=B$ and $S_{n+2}=C$ into equation (1) the substitution value, S, can be calculated thusly $$S = C - (B - A)$$
$$= -37 - (6 + 63)$$
$$= -106$$

Again since blue is the worst case condition the negative extremes of all color signals can be accommodated by a 7-bit ADC with its input biased over the range of 0 to 100 IRE if means are provided to detect negative ADC saturation values and to substitute calculated values therefore.

Figure 6:
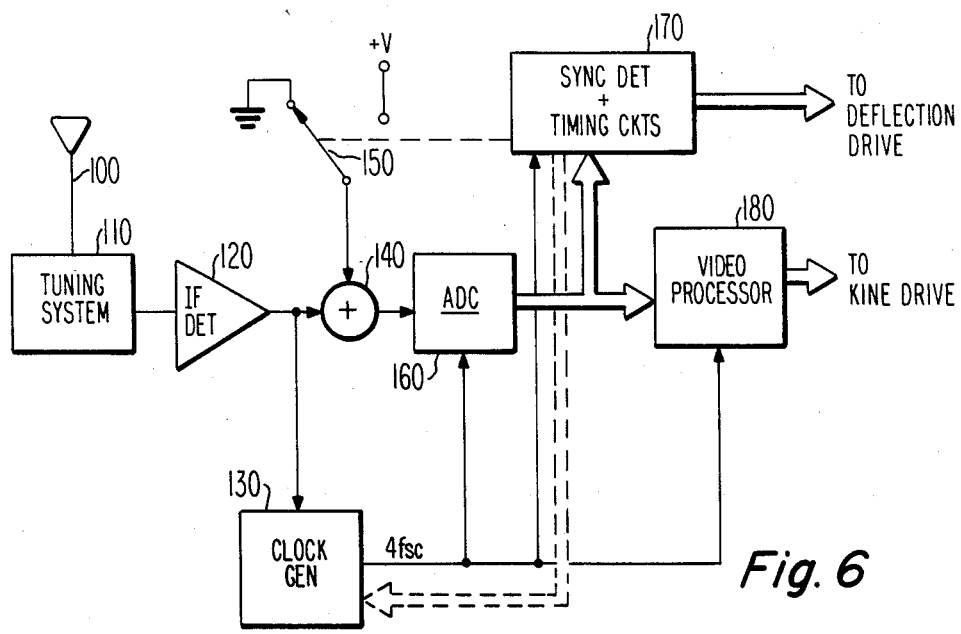
FIG. 6 is a block diagram showing the major components of a digital television receiver including an analog-to-digital conversion system embodying the present invention.

FIG. 6 illustrates in block form a digital TV receiver. Broadcast video from receiving antenna 100 is applied to conventional tuning circuitry 110. Analog signal from tuning circuitry 110 is applied to IF amplifiers and video detector 120 which produces baseband composite video at its output. The composite video from detector 120 is applied to a summer 140 which is responsive to DC voltages applied via switch 150 to selectively apply a DC bias to the signal during the sync and burst interval of the signal. The signal from summer 140 is applied to the input of ADC 160—the offset produced by summer 140 establishing different input ranges to the ADC for sync and burst relative to the image information component of the video signal.

The ADC 160 generates digital manifestations of the analog video signal responsive to a four-times color subcarrier clock signal developed by clock generator 130. Clock generator 130 may be a burst gated phase locked loop responsive to the analog burst component of the composite video signal from detector 120 or, alternatively, it may be responsive to a digitized burst signal coupled via the phantom bus connected between the digital timing circuits 170 and clock generator 130.

Digitized samples from ADC 160 are applied to digital processing circuitry 180 which appropriately conditions the image components of composite video for application to the display tube drivers. Digitized samples from ADC 160 are also applied to digital processing circuitry 170, which is responsive to the vertical and horizontal synchronization components of the composite signal to generate appropriate timing signals to drive the deflection coils of the display tube. Circuitry 170 also generates timing pulses to control switch 150 to apply the DC offset to the analog video input signal.

Figure 7:
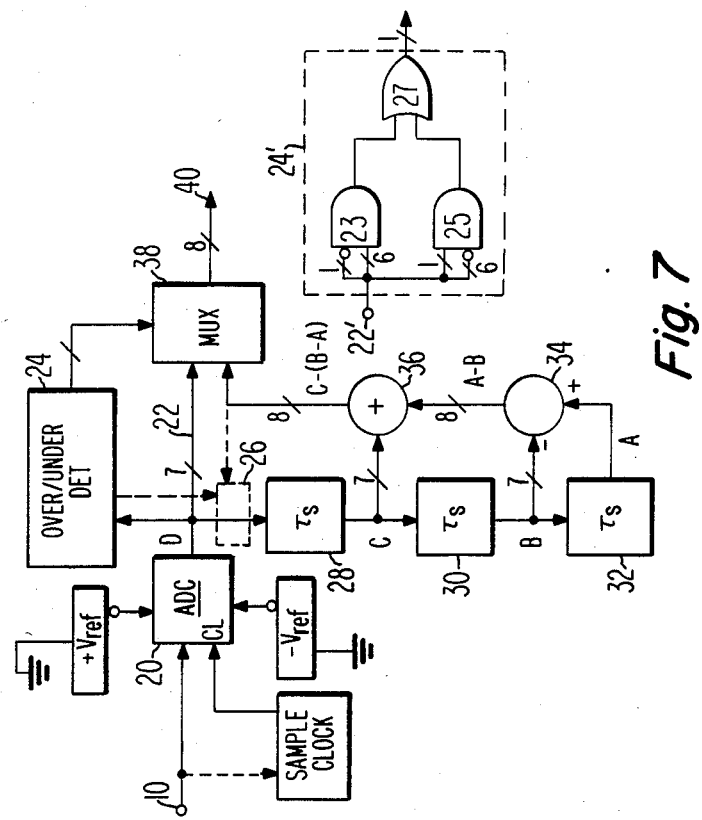

FIG. 7 illustrates in block diagram form an analog-to-digital converter system which may be substituted for ADC 160 in FIG. 6 and operates according to the aforedescribed analog-to-digital conversion method. In the figure, analog signal is applied to terminal 10 from which it is routed to the ADC 20. ADC 20 may be a conventional flash converter which provides, e.g. a 7-bit parallel two's complement output on bus 22. ADC 20 has two further input connections, coupled to potential sources $+V_{ref}$ and $-V_{ref}$, for establishing the signal input range of the converter. In conformance with the foregoing example, $+V_{ref}$ is set to correspond to 100 IRE video signal level and $-V_{ref}$ is set to correspond to zero IRE level.

The output of ADC 20 is applied to over/underflow detector 24 and multiplexer 38. For all values less than the maximum and greater than the minimum output values of ADC 20 over/underflow detector applies a logic zero value to the control input of multiplexer 38. In response to this logic zero signal, multiplexer 38 passes the output values produced by the ADC. For ADC 20 output values equal to its maximum or minimum output values over/underflow detector 24 applies a logic one signal to the control input of multiplexer 38 and responsive thereto multiplexer 38 passes a substitute calculated value from adder 36.

Over/underflow detector 24 may consist of a combinatorial logic circuit as shown in the inset 24'. Element 24' includes a first AND gate 23 having an inverting input coupled to the sign bit of the ADC 20 output and six non-inverting inputs coupled to the six value bits of the ADC output. Gate 23 produces a logic zero output for all applied values except the signal 0111111 for which it provides a logic 1. AND gate 25 is similarly coupled to the ADC signal but is connected to provide a logic 1 output only for the binary signal 1000000. The output signal of AND gates 23 and 25 are applied to respective input terminals of OR gate 27 which provides a logic 1 output signal for ADC binary values 1000000 and 0111111, the minimum and maximum values which can be obtained from ADC 20.

The output values from ADC 20 are also applied to the serially connected delay elements 28, 30 and 32 which each delay the applied samples by one sample period, $\tau_s$. The delayed signals from delay elements 28, 30 and 32 correspond to successive samples C, B and A respectively of equation (1). The signal samples from delay elements 30 and 32 are applied as subtrahend and minuend respectively to subtractor element 34, which generates the values $(A-B)$. The output of subtractor 34 is applied to one input of adder 36. The output from delay element 28 is applied to a second input of adder 36. Adder 36 produces output values corresponding to the values $(A-B)+C=C-(B-A)$. These values are applied to the multiplexer 38 and are substituted for the values from ADC 20 at bus 40 when the ADC 20 output values equal the maximum or minimum values that can be generated by ADC 20.

Another feature of the invention includes a second multiplexer 26 shown in phantom lines which may be interposed between ADC 20 and delay element 28 if desired. Multiplexer 26 is responsive to the over/underflow detector 24 and substitutes the calculated value C−(B−A) into the delay chain (28, 30, 32) and provides better transient response if two successive ADC output values equal the ADC saturation values.

Figure 8:
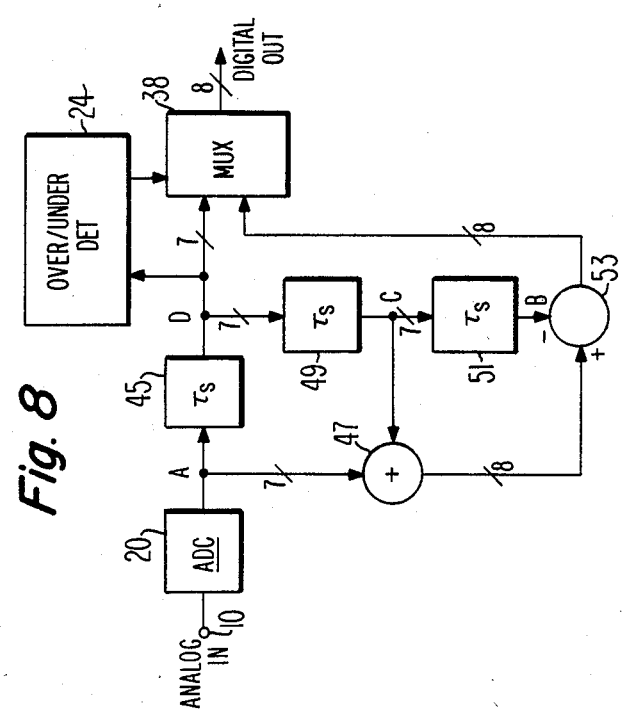
FIGS. 7 and 8 are schematic diagrams of analog to digital conversion systems for video signals embodying the present invention.

Refer next to FIG. 8. Elements in FIG. 8 designated with like numerals as those in FIG. 7 perform identical functions. The FIG. 8 circuit performs a similar function to the FIG. 7 arrangement but calculates the substitution values from two samples preceding the saturation value and the sample following the sample having the saturated value. The FIG. 8 arrangement has the advantage that the substitution value is calculated from three true samples closest in time to the saturated value. Consider the sequence of successive samples $A_1$, $B_1$, $C_1$, $D_1$, $A_2$, $B_2$, $C_2$, $D_2$, etc. Assume sample $D_1$ to have a saturated value. The FIG. 7 circuit calculates a substitution value from samples $A_1$, $B_1$, and $C_1$. The FIG. 8 circuit is arranged to calculate the substitution value for sample $D_1$ from samples $B_1$, $C_1$ and $A_2$.

In FIG. 8, ADC 20 is coupled to multiplexer 38 through delay element 45. The sample, A, available from ADC 20 is one sample later in time than the sample, D, applied to multiplexer 38. Delay elements 49 and 51 serially coupled to delay element 45 contain samples C and B which were respectively obtained one and two sample periods prior to sample D. The samples A, D, C and B correspond to samples $A_2$, $D_1$, $C_1$ and $B_1$. Note that relative to the sinusoidal chrominance signal, samples $A_1$ and $A_2$ are taken at the same phase points and that nothing determines the beginning or end of a given cycle of the signal. Thus, the cycle considered in the calculation may equally likely be defined by points $A_2$, $D_1$, $C_1$, $B_1$ as points $D_1$, $C_1$, $B_1$ and $A_1$.

Returning to FIG. 8, the output samples of ADC 20 and delay element 49 are applied to the adder 47 which produces the sums (A+C). These sums are applied as minuends to subtractor 53 and samples from delay element 51 are applied as subtrahends to subtractor 53. Subtractor 53 produces the difference samples (A+C)−B=C−(B−A) which are thereafter applied to multiplexer 38 to be used as substitution values.

In FIGS. 7 and 8 the ADC 20 produces a 7-bit output signal. However, adders and subtractors 36, 47, 34 and 53 can generate 8-bit signals. The output of the multiplexer must therefore accommodate 8-bit signals. Thus, the system which includes an N-bit ADC provides a partial N+1 bit output conversion.

In a two's complement binary system the most significant bit positions (Nth bit) is allocated to the sign bit. The eighth bit of the multiplexer output signal is therefor allocated to the sign bit but the seventh bit of the ADC output corresponds to the sign bit. It is necessary therefor that one bit position be interposed between the normal sixth and seventh bit positions of the ADC output samples in order to conform to the calculated output sample format. The extra bit may be added to the ADC signal samples in the multiplexer. The added bit must correspond to a value of zero for both positive and negative binary two's complement numbers since the 7-bit ADC is not capable of producing a value for this bit position. It should be noted that a zero value is a logic zero for a positive number and a logic one is a zero value for a negative two's complement number. Also, the sign bit is a logic zero for a positive number and a logic one for a negative number. All that is required to add the eighth bit is to replicate the sign bit in the seventh and eighth bit positions.

It will be readily appreciated by those skilled in the art, that the calculated substitute values may also be derived from samples all of which succeed the saturated value with similar circuitry.

The choice of sampling phases is also arbitrary. Sampling need not be performed in phase with burst, however, the choice of sampling phase will affect the degree to which the sampling range may be compressed.

What is claimed is:

1. Apparatus for converting analog signal to digital sample format, comprising: an analog-to-digital converter biased to have a dynamic range less than the dynamic range of said analog signal; means for detecting saturated digital samples produced by said converter which correspond to analog signals exceeding the dynamic range of said converter, means for calculating digital sample values from regularly occurring digital samples taken proximate to said saturated samples and means for substituting said calculated digital samples for said saturated samples produced by said converter.

2. The apparatus set forth in claim 1 wherein said means for calculating digital samples includes means for combining digital samples occurring prior to said saturated samples.

3. The apparatus set forth in claim 2 wherein said means for calculating digital samples includes means for combining digital samples taken subsequent to said saturated samples as well as said prior samples in the calculated sample values.

4. Apparatus for converting analog signal to digital sample format, comprising:
means for applying an analog signal having a determinate dynamic range;
an analog-to-digital converter having an output terminal at which digital samples are available and having an input terminal coupled to said means for applying analog signal and wherein the input dynamic range of said converter is less than the dynamic range of said analog signal;
means for detecting the occurrence of digital samples produced by said converter that correspond to analog input signals equal to or exceeding the dynamic range of said converter and providing a control signal responsive to such occurrence;
a multiplexer having a first digital input port coupled to said analog-to-digital converter, a second digital input port, a control input terminal coupled to receive said control signal and an output port at which digital samples are available from said apparatus;
means coupled to said converter for successively storing R successive digital samples, wherein R is an integer, so that including the digital sample immediately available from the converter R+1 successive digital samples are available;
means for combining ones of said R+1 samples to produce a digital sample corresponding in time to the sample present at the first digital input port of said multiplexer; and means for coupling said means for combining to the second input port of the multiplexer.

5. The apparatus set forth in claim 4 wherein the means for storing R samples comprises three serially coupled delay elements, each delay element providing a delay time of one sample period.

6. The apparatus set forth in claim 5 wherein said three serially coupled delay elements are designated first, second and third delay elements, said first and third delay elements being coupled closest and farthest from the converter respectively and the means for combining comprises:

a subtractor circuit connected for subtracting samples from said second delay element from samples from said third delay element;

an adder circuit connected for adding samples from said first delay element to differences produced by said subtractor circuit; and means for coupling said adder circuit to said multiplexer.

7. The apparatus set forth in claim 5 wherein said multiplexer is coupled to said converter via said first delay element and the means for combining comprises:

an adder circuit connected for adding samples from said second delay element to samples currently available from said converter;

a subtractor connected for subtracting samples from said third delay element from sums produced by said adder circuit; and means for applying the differences produced by said subtractor to the second input port of said multiplexer.

8. In a television receiver arranged to process video signals in digital format at a sample rate of substantially four times the color subcarrier frequency, apparatus for converting analog video signal to binary digital samples, comprising;

a source of analog video signal;

an analog-to-digital converter having an output terminal, having an input terminal coupled to said source of analog signal and wherein the input dynamic range of said converter is less than the dynamic range of said analog signal;

means for detecting the occurrence of digital samples produced by said converter that correspond to analog input signals exceeding the dynamic range of said converter and providing a control signal responsive to such occurrence;

a multiplexer having a first digital input port coupled to said analog-to-digital converter, a second digital input port, a control input terminal coupled to receive said control signal and an output port at which digital samples are available from said apparatus;

means coupled to said converter for successively storing R successive digital samples, where R is an integer, so that including the digital sample immediately available from the converter $R+1$ successive digital samples are available;

means for combining ones of said $R+1$ samples to produce a digital sample corresponding in time to the sample present at the first digital input port of said multiplexer; and means for coupling said means for combining to the second input port of the multiplexer.

* * * * *